(12) United States Patent
Lin et al.

(10) Patent No.: US 9,105,720 B2
(45) Date of Patent: Aug. 11, 2015

(54) SEMICONDUCTOR DEVICE HAVING METAL GATE AND MANUFACTURING METHOD THEREOF

(71) Applicant: UNITED MICROELECTRONICS CORP., Hsin-Chu (TW)

(72) Inventors: Chun-Hsien Lin, Tainan (TW); An-Chi Liu, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 1 day.

(21) Appl. No.: 14/023,481

(22) Filed: Sep. 11, 2013

(65) Prior Publication Data

US 2015/0069533 A1    Mar. 12, 2015

(51) Int. Cl.
| | |
|---|---|
| *H01L 29/78* | (2006.01) |
| *H01L 21/28* | (2006.01) |
| *H01L 29/49* | (2006.01) |
| *H01L 21/8238* | (2006.01) |
| *H01L 29/51* | (2006.01) |
| *H01L 29/66* | (2006.01) |

(52) U.S. Cl.
CPC ...... *H01L 29/7833* (2013.01); *H01L 21/28088* (2013.01); *H01L 21/823842* (2013.01); *H01L 29/4966* (2013.01); *H01L 29/6659* (2013.01); *H01L 29/66545* (2013.01); *H01L 29/517* (2013.01); *H01L 29/665* (2013.01)

(58) Field of Classification Search
CPC ... H01L 29/513; H01L 29/517; H01L 29/518; H01L 21/28202; H01L 21/28185

USPC ............. 257/40–42, 59, 66, 72, 410; 438/591
See application file for complete search history.

(56) References Cited

U.S. PATENT DOCUMENTS

| | | | |
|---|---|---|---|
| 6,066,533 A | 5/2000 | Yu | |
| 6,271,136 B1 | 8/2001 | Shue et al. | |
| 6,492,217 B1 | 12/2002 | Bai | |
| 6,552,377 B1 | 4/2003 | Yu | |
| 6,596,643 B2 | 7/2003 | Chen et al. | |
| 6,696,345 B2 | 2/2004 | Chau | |
| 6,790,719 B1 | 9/2004 | Adetutu | |
| 6,794,234 B2 | 9/2004 | Polishchuk | |
| 6,902,969 B2 | 6/2005 | Adetutu | |
| 6,921,711 B2 | 7/2005 | Cabral, Jr. | |
| 7,030,430 B2 | 4/2006 | Doczy | |

(Continued)

OTHER PUBLICATIONS

PalDey et al., Single layer and multilayer wear resistant coatings of (Ti, Al)N: a review, 2002.

*Primary Examiner* — Matthew W Such
*Assistant Examiner* — Monica D Harrison
(74) *Attorney, Agent, or Firm* — Winston Hsu; Scott Margo

(57) ABSTRACT

A method for manufacturing a semiconductor device having metal gate includes following steps. A substrate having at least a first semiconductor device formed thereon is provided. The first semiconductor device includes a first gate trench formed therein. Next, an n-typed work function metal layer is formed in the first gate trench. After forming the n-typed work function metal layer, a nitridation process is performed to form a first protecting layer on the n-typed work function metal layer. After forming the first protecting layer, an oxidation process is performed to the first protecting layer to form a second protecting layer on the n-typed work function metal layer. Then, a gap filling metal layer is formed to fill up the first gate trench.

13 Claims, 10 Drawing Sheets

(56) References Cited

U.S. PATENT DOCUMENTS

| | | |
|---|---|---|
| 7,074,664 B1 | 7/2006 | White |
| 7,109,079 B2 | 9/2006 | Schaeffer, III |
| 7,126,199 B2 | 10/2006 | Doczy |
| 7,157,378 B2 | 1/2007 | Brask |
| 7,193,893 B2 | 3/2007 | Forbes |
| 7,208,366 B2 | 4/2007 | Tsai |
| 7,381,619 B2 | 6/2008 | Wang |
| 7,390,709 B2 | 6/2008 | Doczy |
| 7,488,656 B2 | 2/2009 | Cartier |
| 7,785,958 B2 | 8/2010 | Doczy |
| 8,058,119 B2 | 11/2011 | Chung et al. |
| 8,294,202 B2 | 10/2012 | Jangjian et al. |
| 8,546,212 B2 * | 10/2013 | Su et al. .................. 438/216 |
| 8,728,908 B2 * | 5/2014 | Xie et al. .................. 438/431 |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0148838 A1 | 6/2007 | Doris |
| 2007/0210354 A1 | 9/2007 | Nabatame |
| 2008/0076216 A1 | 3/2008 | Pae |
| 2008/0318371 A1 | 12/2008 | Lin |
| 2009/0057787 A1 | 3/2009 | Matsuki |
| 2009/0166769 A1 | 7/2009 | Metz |
| 2010/0052074 A1 | 3/2010 | Lin |
| 2010/0068877 A1 | 3/2010 | Yeh |
| 2010/0081262 A1 | 4/2010 | Lim |
| 2010/0127336 A1 | 5/2010 | Chambers et al. |
| 2011/0175147 A1 | 7/2011 | Adusumilli et al. |
| 2013/0056836 A1 | 3/2013 | Yu et al. |

* cited by examiner

SEMICONDUCTOR DEVICE HAVING METAL GATE AND MANUFACTURING METHOD THEREOF

BACKGROUND OF THE INVENTION

1. Field of the Invention

The invention relates to a semiconductor device having metal gate and a manufacturing method thereof, and more particularly, to a semiconductor device having metal gate and a manufacturing method capable of prevention metal diffusion and improving gap-fill result.

2. Description of the Prior Art

With a trend toward scaling down the size of the semiconductor device, work function metals are used to replace the conventional polysilicon gate to be the control electrode that competent to the high dielectric constant (herein after abbreviated as high-k) gate dielectric layer. The conventional metal gate methods are categorized into the gate first process and the gate last process. Among the two main processes, the gate last process is able to avoid processes of high thermal budget and to provide wider material choices for the high-k gate dielectric layer and the metal gate, and thus the gate last process gradually replaces the gate first process.

In the conventional gate last process, a dummy gate or a replacement gate is formed on a substrate and followed by steps of forming a conventional metal-oxide semiconductor (MOS) transistor device. Subsequently, the dummy/replacement gate is removed to form a gate trench. Then the gate trench is filled with work function metals required by different conductivity types and gap filling metals. Often, it may employ material such as aluminum (Al) as the gap filling metal. It has been observed that Al may diffuse into the work function metals, and thus the electrical property of the work function metal is adversely influenced. As a countermeasure against to the problems, there has been proposed the barrier layers to prevent the Al diffusion.

To provide prevention to the Al diffusion, multi-layered barrier structure including at least a titanium nitride (hereinafter abbreviated as TiN) layer or a tantalum nitride (hereinafter abbreviated as TaN) is developed. However, it is found the multi-layered barrier structure is still insufficient to prevent the Al diffusion. Furthermore, the multi-layered barrier structure narrows the opening of the gate trench and thus causes gap-filling issue.

Accordingly, though the gate last process is able to avoid processes of high thermal budget and to provide wider material choices for the high-k gate dielectric layer and the metal gate, the gate last process still faces material requirements for the complicated processes and reliability requirement for the layers filling in the gate trench.

SUMMARY OF THE INVENTION

According to an aspect of the present invention, a method for manufacturing a semiconductor device having metal gate is provided. According to the method, a substrate having at least a first semiconductor device formed thereon is provided. The first semiconductor device includes a first gate trench formed therein. Next, an n-typed work function metal layer is formed in the first gate trench. After forming the n-typed work function metal layer, a nitridation process is performed to form a first protecting layer on the n-typed work function metal layer. After forming the first protecting layer, an oxidation process is performed to the first protecting layer to form a second protecting layer on the n-typed work function metal layer. Then, a gap filling metal layer is formed to fill up the first gate trench.

According to another aspect of the present invention, a semiconductor device having metal gate is provided. The semiconductor device having metal gate includes a substrate, a high-k gate dielectric layer formed on the substrate, an n-typed work function metal layer formed on the high-k gate dielectric layer, a first protecting layer formed on the n-typed work function metal layer, a second protecting layer formed on the first protecting layer, and a gap filling metal layer directly formed on the second protecting layer. It is noteworthy that the first protecting layer includes a nitrified material of the n-typed work function metal layer, and the second protecting layer includes an oxidized material of the first protecting layer.

According to the method for manufacturing the semiconductor device having metal gate provided by the present invention, the protecting layer is formed by sequentially performing the nitridation process and the oxidation process to the n-typed work function metal layer. Therefore no additional protecting/barrier layer is deposited on the n-typed work function metal layer in the gate trench. In other words, fewer layers are deposited in the gate trench and thus gap filling result of the ensuing layers formed in the gate trench is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are drawings illustrating a manufacturing method for a semiconductor device having metal gate provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIGS. 6, and FIG. 8 is a schematic drawing in a step subsequent to FIG. 7.

FIGS. 9-10 are drawings illustrating a manufacturing method for a semiconductor device having metal gate provided by a second preferred embodiment, wherein FIG. 10 is a schematic drawing in a step subsequent to FIG. 9.

DETAILED DESCRIPTION

Figure 1:
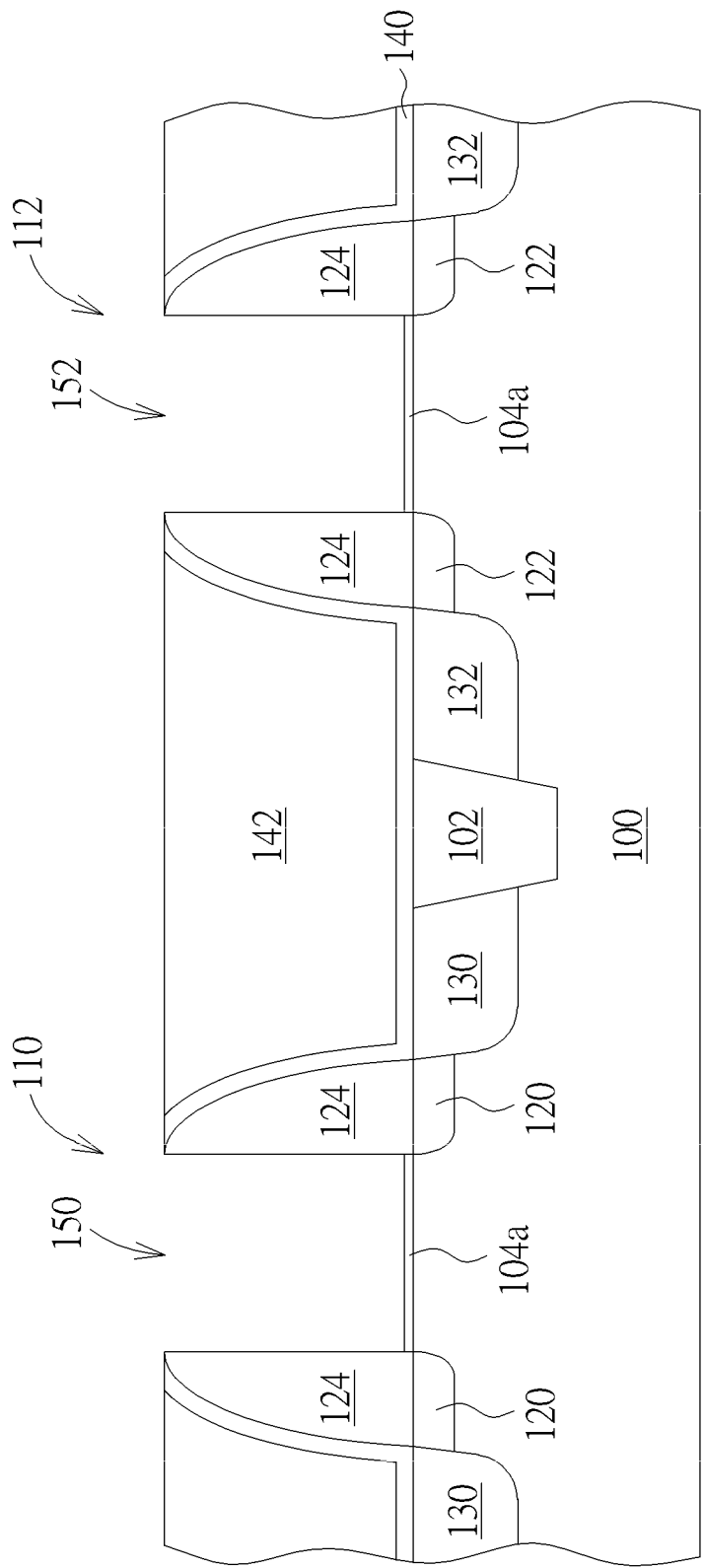

Please refer to FIGS. 1-8, which are drawings illustrating a manufacturing method for a semiconductor device having metal gate provided by a first preferred embodiment of the present invention. As shown in FIG. 1, the preferred embodiment first provides a substrate 100 such as a silicon substrate, a silicon-containing substrate, or a silicon-on-insulator (SOI) substrate. The substrate 100 includes a first semiconductor device 110 and a second semiconductor device 112 formed thereon. A shallow trench isolation (STI) 102 is formed in the substrate 100 between the first semiconductor device 110 and the second semiconductor device 112 for providing electrical isolation. The first semiconductor device 110 includes a first conductivity type, the second semiconductor device 112 includes a second conductivity type, and the first conductivity type and the second conductivity type are complementary. In the preferred embodiment, the first semiconductor device 110 is an n-typed semiconductor device and the second semiconductor device 112 is a p-typed semiconductor device.

Please still refer to FIG. 1. The first semiconductor device 110 and the second semiconductor device 112 respectively include a dielectric layer 104*a* and a dummy gate such as a polysilicon layer (not shown), and a patterned hard mask (not shown) formed on the polysilicon layer for defining the dummy gate. The first semiconductor device 110 and the second semiconductor device 112 further respectively include first lightly-doped drains (hereinafter abbreviated as LDDs) 120 and second LDDs 122, a spacer 124, a first source/drain 130 and a second source/drain 132. Salicides (not shown) are respectively formed on surfaces of the first source/drain 130 and the second source/drain 132. On the first semiconductor device 110 and the second semiconductor device 112, a contact etch stop layer (hereinafter abbreviated as CESL) 140 and an inter-layer dielectric (hereinafter abbreviated as ILD) layer 142 are sequentially formed.

Please still refer to FIG. 1. Subsequently, a planarization process is performed to remove a portion of the CESL 140 and a portion of the ILD layer 142 and followed by performing a suitable etching process to remove the patterned hard mask layers and the dummy gates of the first semiconductor device 110 and the second semiconductor device 112. Consequently, a first gate trench 150 is formed in the first semiconductor device 110 and a second gate trench 152 is formed in the second semiconductor device 112, simultaneously. And the dielectric layer 104*a* is exposed at bottoms of both of the first gate trench 150 and the second gate trench 152.

Figure 2:
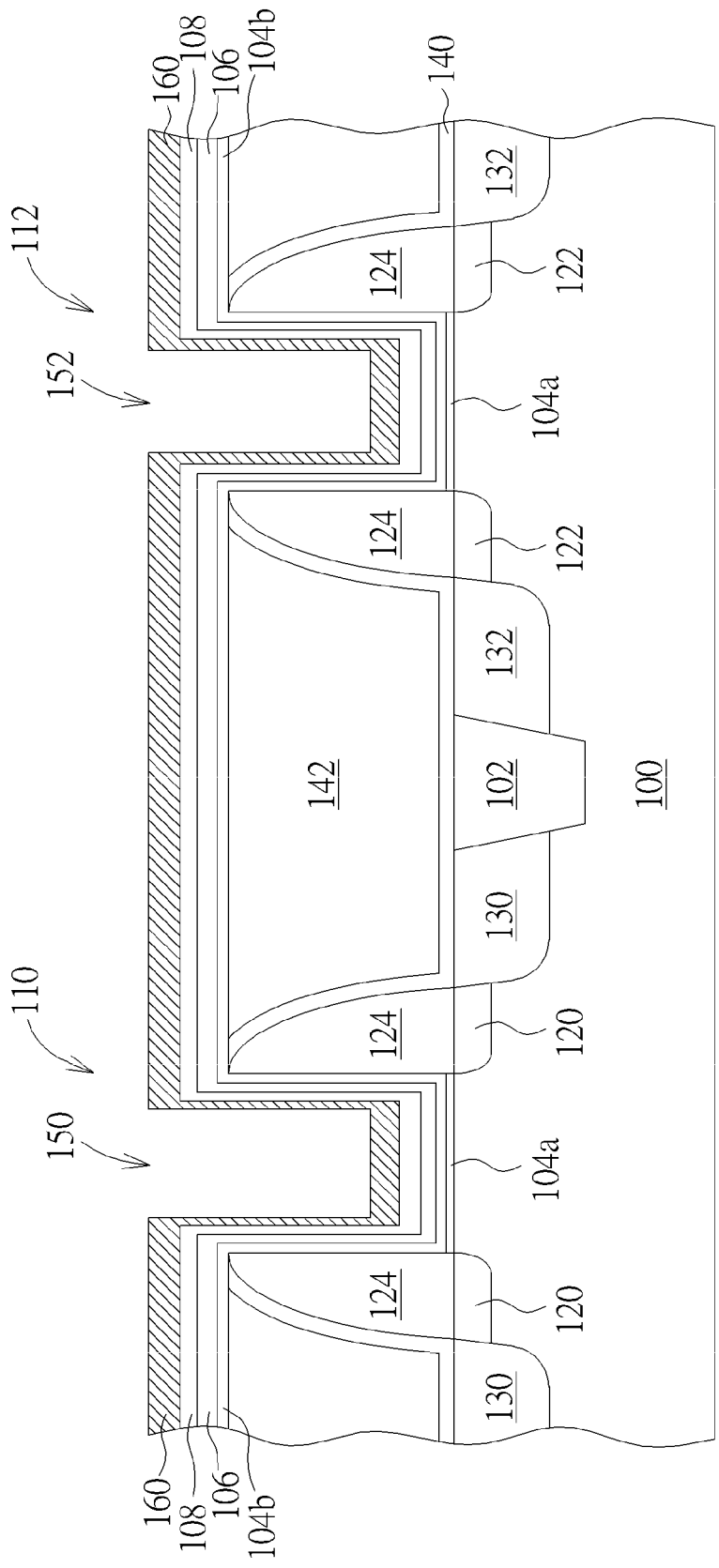

Please refer to FIG. 2. After forming the first gate trench 150 and the second gate trench 152, a high-k gate dielectric layer 104*b* is formed on the substrate 100. It is noteworthy that the preferred embodiment is integrated with the high-k last process, therefore the dielectric layer 104*a* exposed in the gate trenches 150/152 can be used as an interfacial layer 104*a*. The high-k gate dielectric layer 104*b* includes high-k materials such as rare earth metal oxide. For example but not limited to, the high-k gate dielectric layer 104*b* can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

Please still refer to FIG. 2. After forming the high-k gate dielectric layer 104*b*, a bottom barrier layer 106, an etch stop layer 108, and a p-typed work function metal layer 160 are sequentially formed in the gate trenches 150/152 and on the substrate 100. Typically, the bottom barrier layer 106 includes TiN, and the etch stop layer 108 includes TaN, but not limited to this. The p-typed work function metal layer 160 includes metal material having a work function of about 4.85 eV, for example but not limited to TiN.

Figure 3:
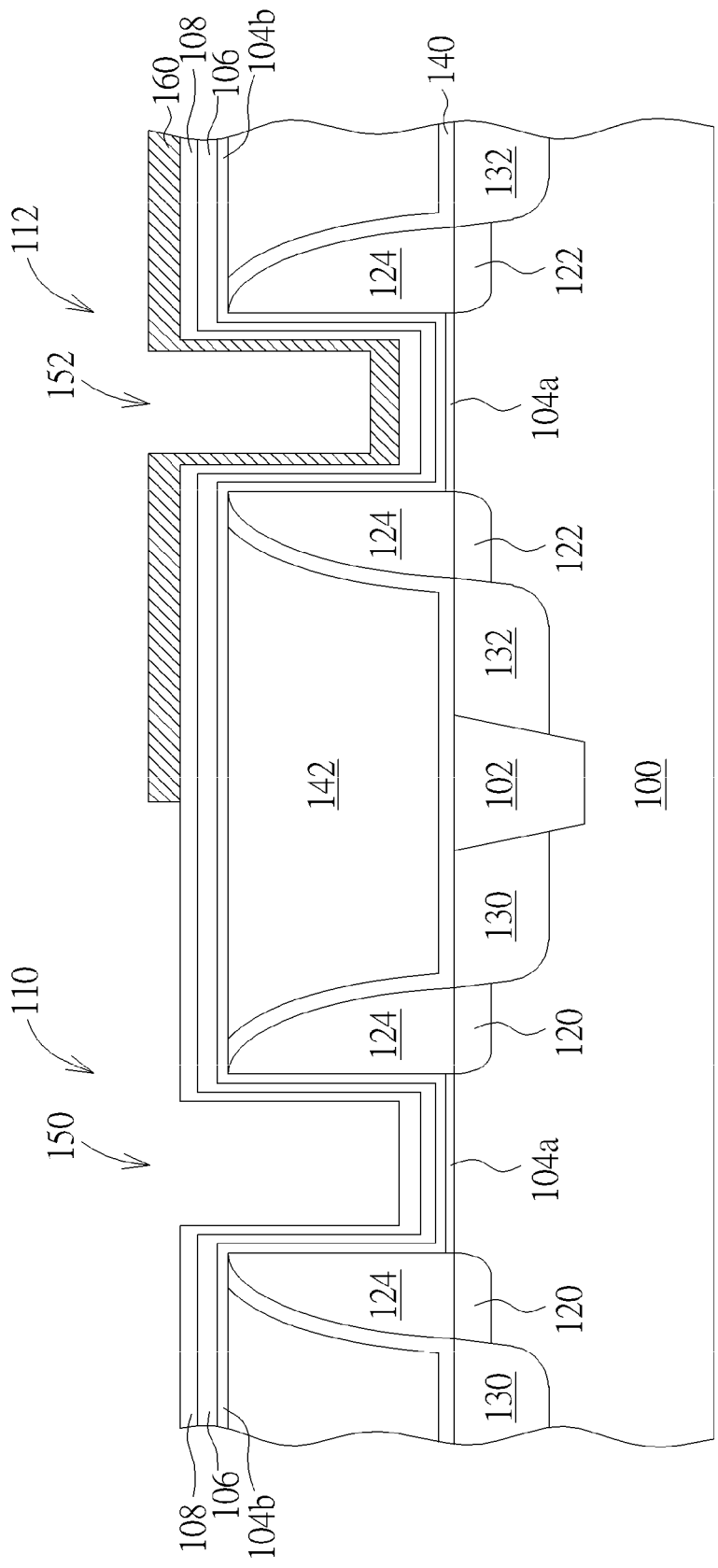

Please refer to FIG. 3. After forming the first work function metal layer 160, a patterned protecting layer (not shown) is formed on the substrate 100 to protect the second semiconductor device 112 and expose the first semiconductor device 110, particularly to expose the first work function metal layer 160 in the first gate trench 150. Subsequently, an etching process is performed to remove the exposed first work function metal layer 160 from the first gate trench 150. It is noteworthy that this instant etching process stops at the etch stop layer 108. In other words, the bottom barrier layer 106 and the high-k dielectric layer 104*b* in the first gate trench 150 are protected by the etch stop layer 108 during removing the first work function metal layer 160 from the first gate trench 150.

Figure 4:
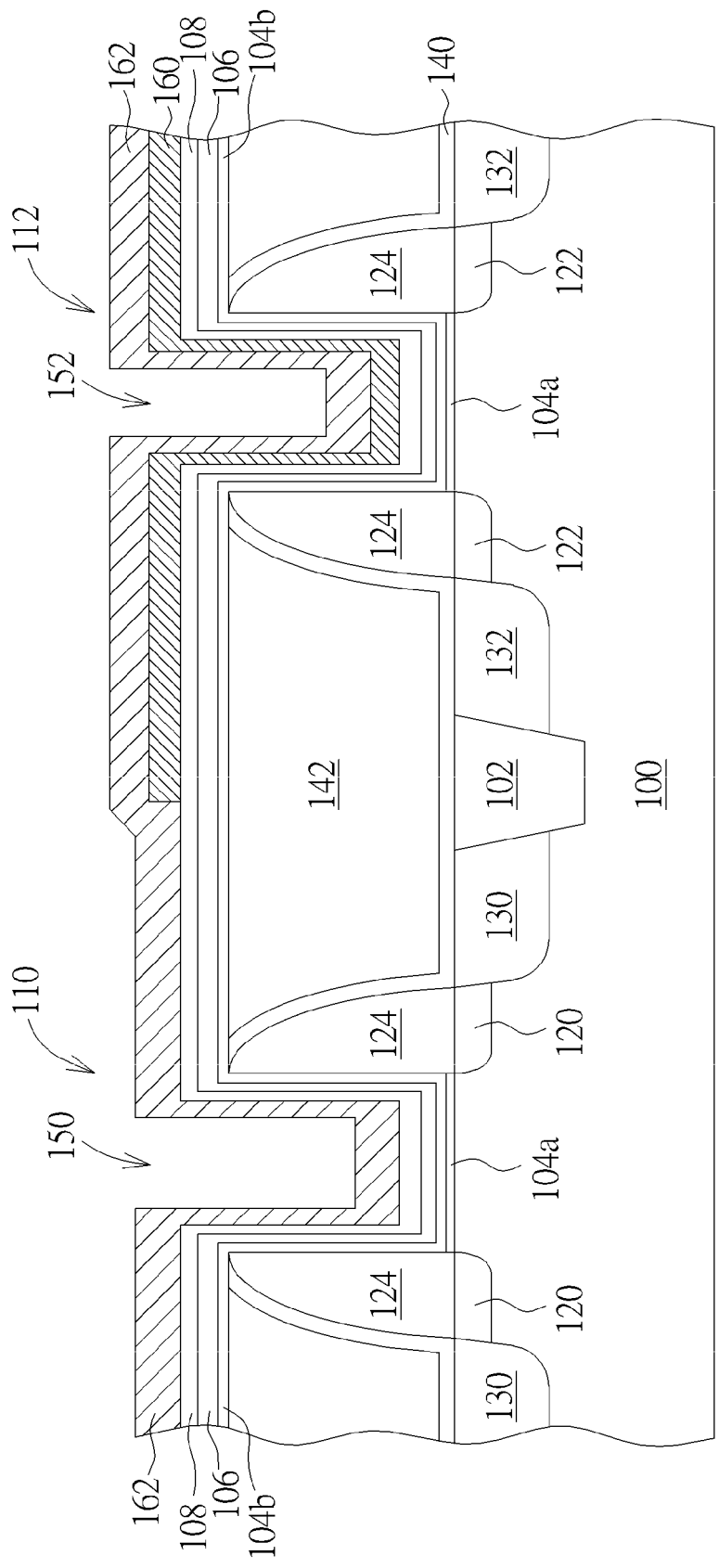

Please refer to FIG. 4. Next, an n-typed work function metal layer 162 is formed in the first gate trench 150 and the second gate trench 152. The n-typed work function metal layer 162 includes metal materials having a work function of about 3.95 eV, for example but not limited to titanium aluminide (hereinafter abbreviated as TiAl). A thickness of the n-typed work function metal layer 162 is about 100 Angstroms (Å), but not limited to this.

Figure 5:
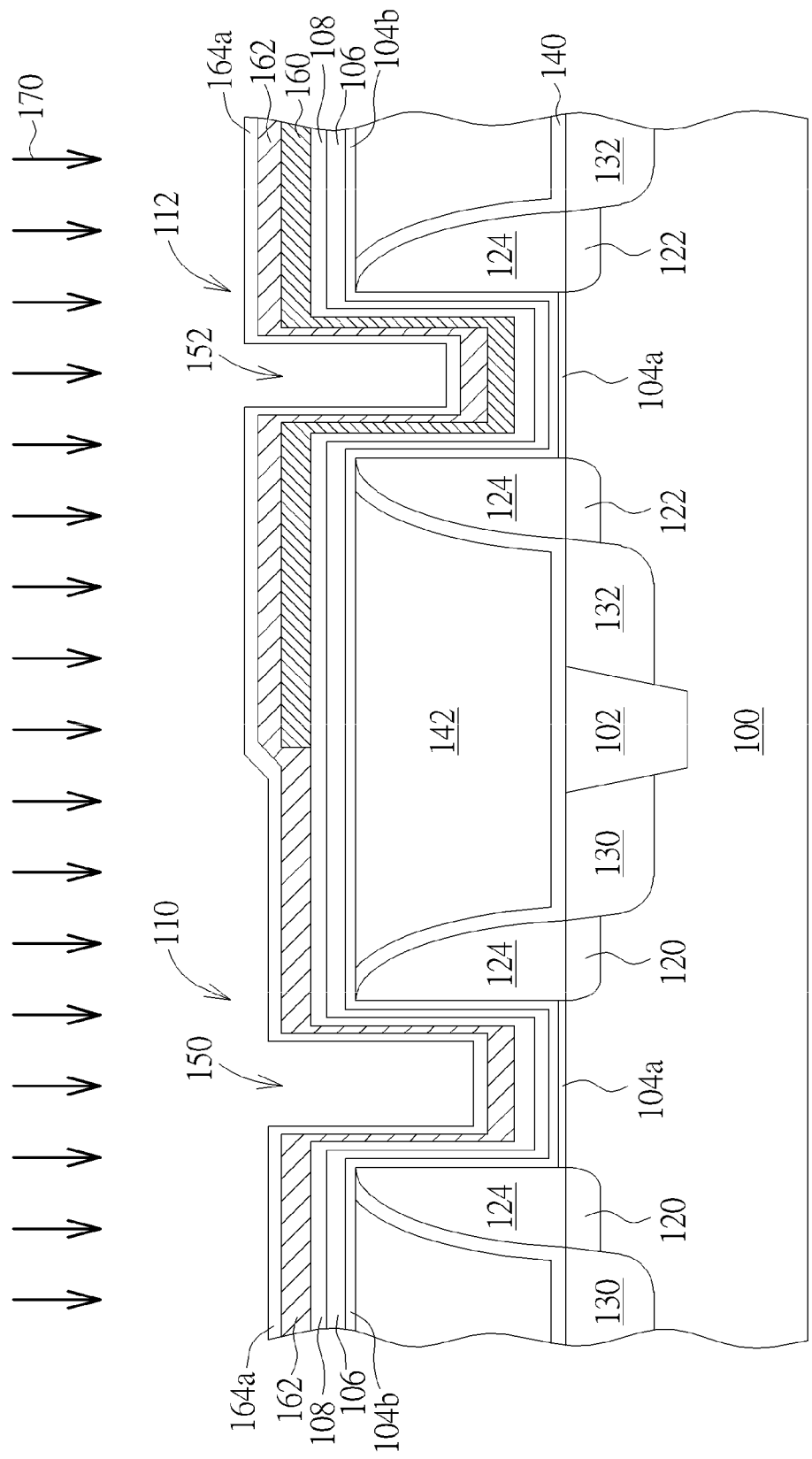

Please refer to FIG. 5. After forming the n-typed work function metal layer 162, a nitridation process 170 is performed to the n-typed work function metal layer 162. Accordingly, a portion of the n-typed work function metal layer 162 is nitrified, and a first protecting layer 164*a* is therefore formed on the n-typed work function metal layer 162. The first protecting layer 164*a* includes a nitrified material of the n-typed work function metal layer 162. For example, when the n-typed work function metal layer 164 includes TiAl, the first protecting layer 164*a* includes a titanium aluminum nitride (hereinafter abbreviated as TiAlN). In the preferred embodiment, the nitridation process 170 includes nitrogen ($N_2$) or ammonia ($NH_3$). The nitridation process 170 can be, for example but not limited to, a $N_2$ plasma treatment or a $NH_3$ plasma treatment. In accordance with the preferred embodiment, a low frequency (LF) power of the $N_2$ plasma treatment is about 0-100 W, a high frequency (HF) power of the $N_2$ plasma treatment is about 200-600 W. A flow rate of nitrogen in the $N_2$ plasma treatment is about 5-200 standard cubic centimeters per minute (sccm). A process pressure of the $N_2$ plasma treatment is smaller than 15 Torr, a process temperature of the $N_2$ plasma treatment is lower than 350° C., and a process duration of the $N_2$ plasma treatment is greater than 60 seconds (sec.).

Figure 6:
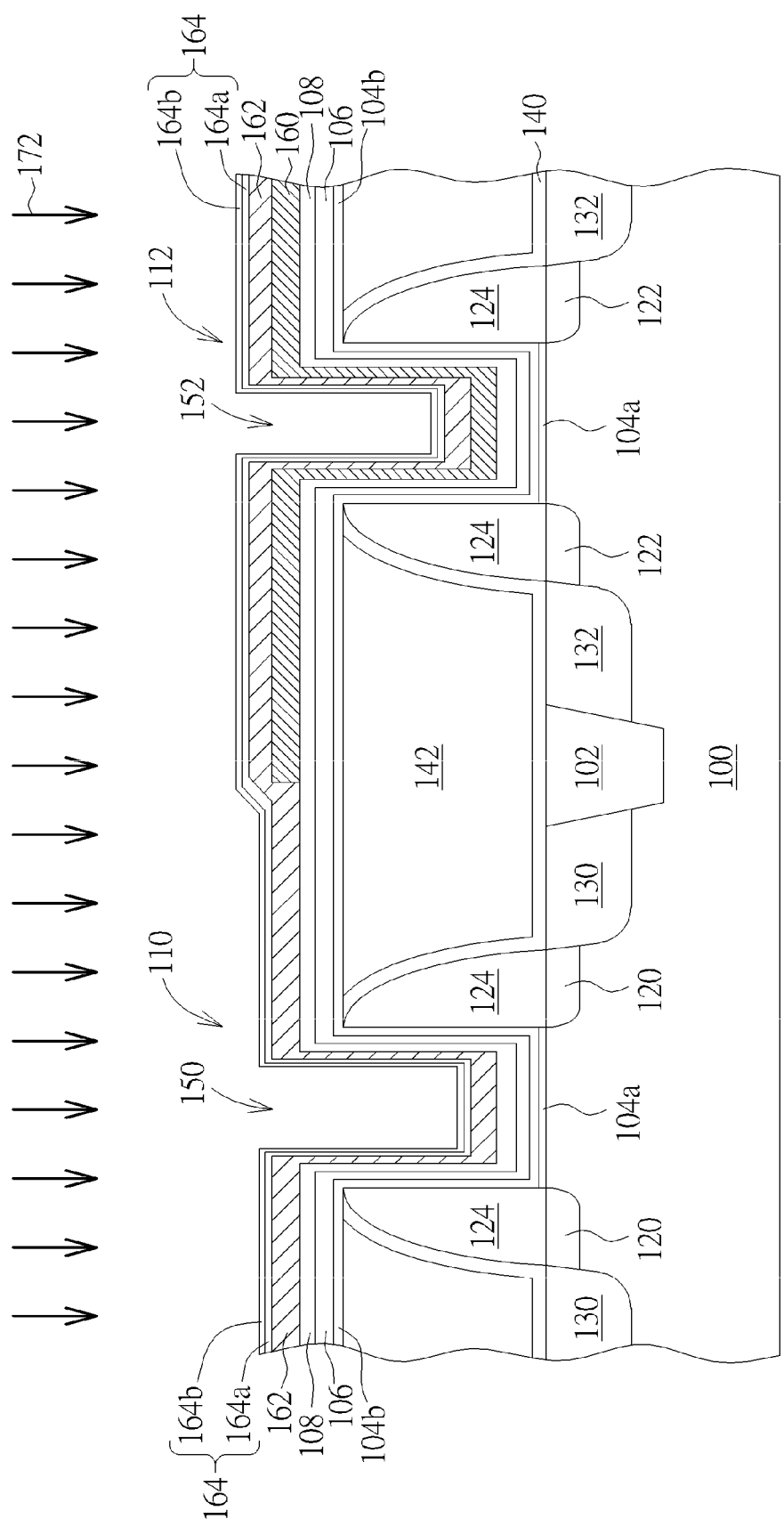

Please refer to FIG. 6. After forming the TiAlN layer 162 by performing the nitridation process 170, an oxidation process 172 is performed to the TiAlN layer 162. In the preferred embodiment, the oxidation process 172 includes dinitrogen monoxide ($N_2O$) or oxygen ($O_2$). The oxidation process 172 can be, for example but not limited to, a $N_2O$ treatment or an $O_2$ treatment. In accordance with the preferred embodiment, a LF power of the $N_2O$ plasma treatment is about 250-1000 W, a HF power of the $N_2O$ plasma treatment is about 200-600 W. A flow rate of $N_2O$ in the $N_2O$ plasma treatment is about 100-3000 sccm. A process pressure of the $N_2O$ plasma treatment is smaller than 15 Torr, a process temperature of the $N_2O$ plasma treatment is lower than 350° C., and a process duration of the $N_2O$ plasma treatment is between 40 sec. and 120 sec. Consequently, a second protecting layer 164*b* is formed on the first protecting layer 164*a*. The second protecting layer 164*b* includes an oxidized material of the first protecting layer 164*a*. For example, when the first protecting layer 164*a* includes TiAlN, the second protecting layer 164*b* includes TiAlNO. The first protecting layer 164*a* and the second protecting layer 164*b* cooperatively serve as a barrier layer 164. More important, an overall thickness of the second protecting layer 164*b* (that is the TiAlNO layer 164*b*) and of the first protecting layer 164a (That is the TiAlN layer 164a) is smaller than one-third of an original thickness of the n-typed work function metal layer 162. In other words, the overall thickness of the first protecting layer 164a and the second protecting layer 164b is smaller than a half of the thickness of a final thickness of the n-typed work function metal layer 162. Accordingly, the overall thickness of the first protecting layer 164a and the second protecting layer 164b is between 20 Å and 30 Å.

Figure 7:
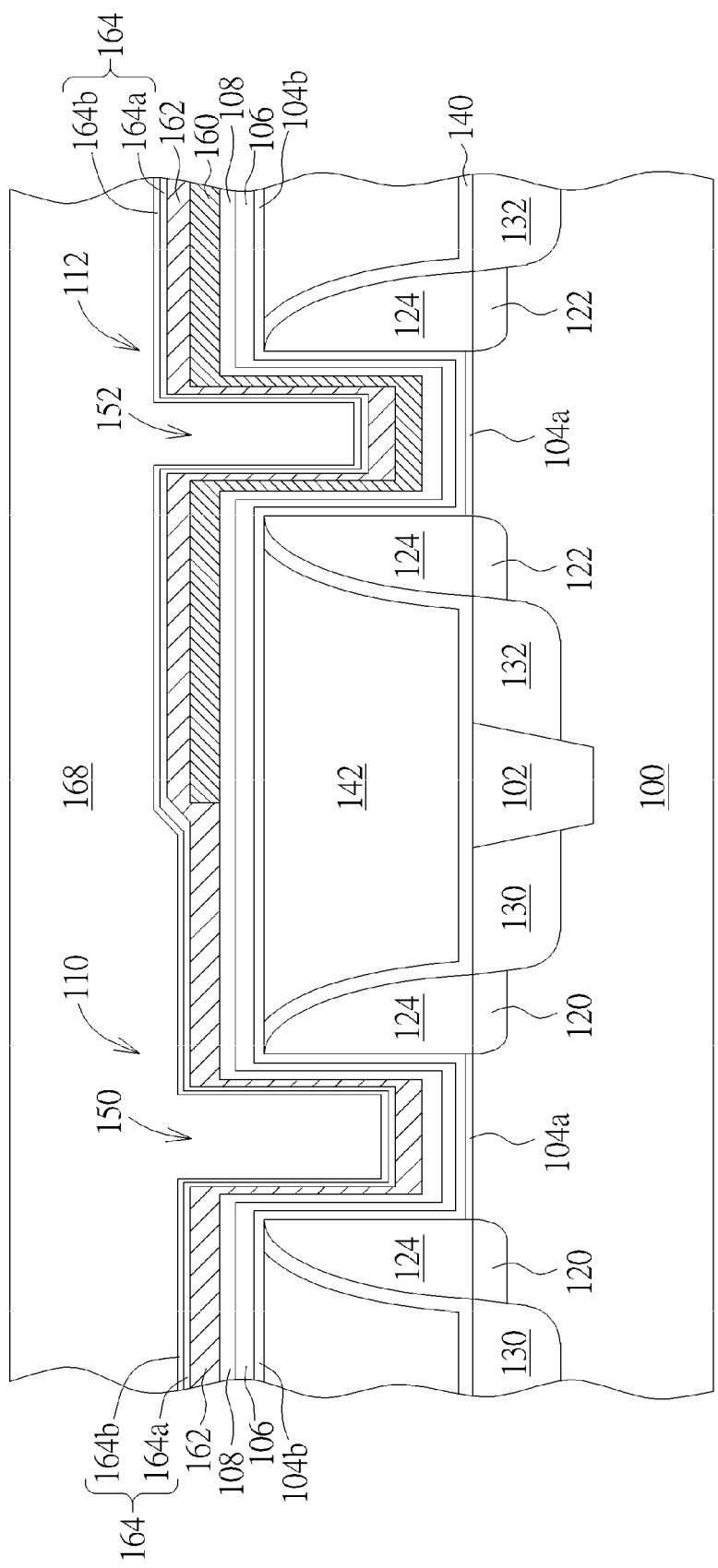

Please refer to FIG. 7. After forming the second protecting layer 164b, a gap-filling metal layer 168 is formed on the substrate 100. The gap filling metal layer 168 includes materials with low resistance and superior gap-filling characteristic such as Al, but not limited to this. It is noteworthy that the gap-filling metal layer 168 is directly formed on the second protecting layer 164b. In other words, the gap-filling metal layer 168 contacts the second protecting layer 164b.

Figure 8:
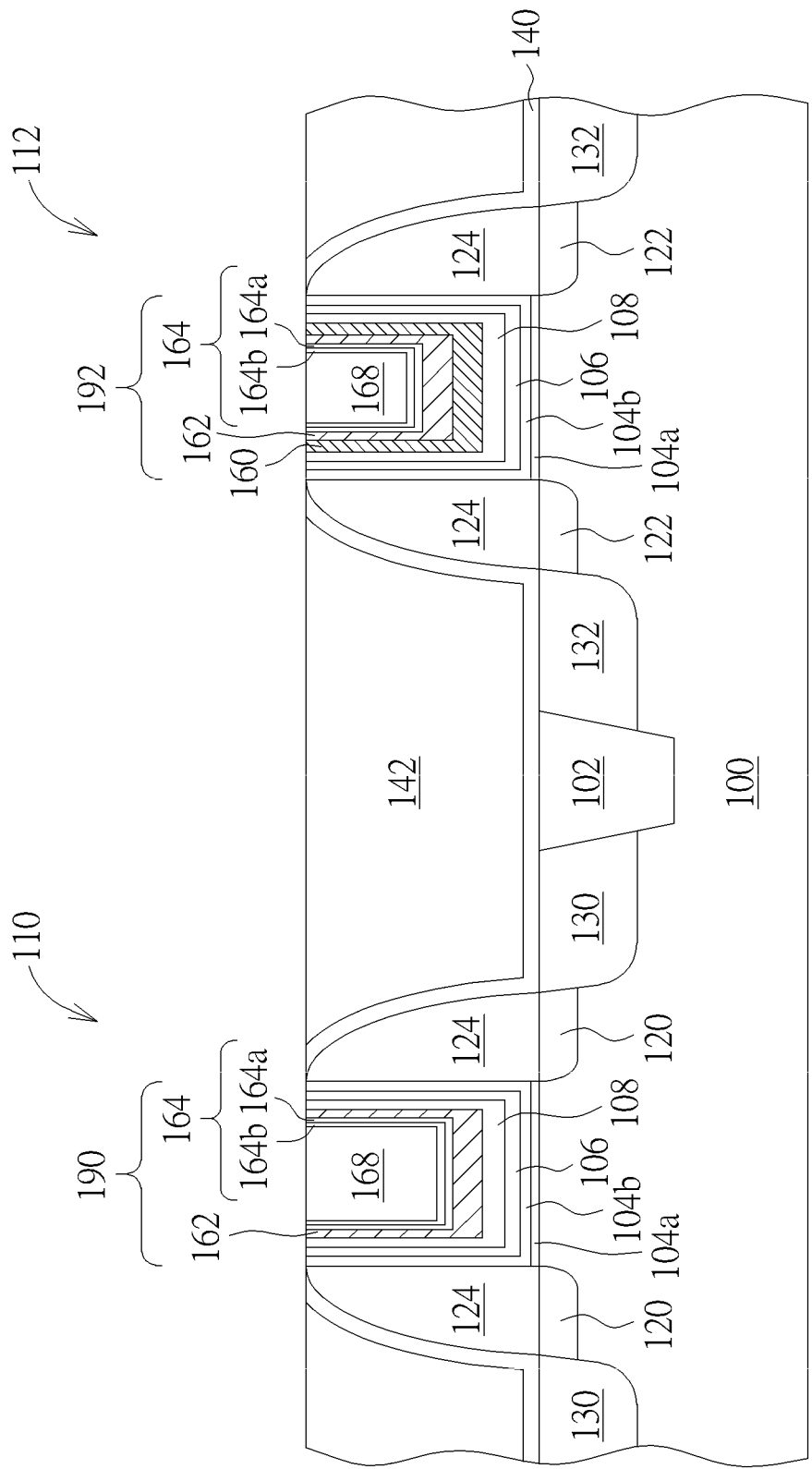

Please refer to FIG. 8. After forming the gap-filling metal layer 168, a planarization process, such as a CMP process, is performed to remove the superfluous gap-filling metal layer 168, barrier layer 164, n-typed work function metal layer 162, p-typed work function metal layer 160, etch stop layer 108, bottom barrier layer 106 and high-k gate dielectric layer 104b. Consequently, a first metal gate 190 and a second metal gate 192 are obtained. In addition, the ILD layer 142 and the CESL 140 can be selectively removed and sequentially reformed on the substrate 100 for improving performance of the semiconductor devices 110/112 in the preferred embodiment. Since the abovementioned CMP process is well-known to those skilled in the art, those details are omitted in the interest of brevity.

According to the method for manufacturing the semiconductor device having metal gate provided by the preferred embodiment, the high-k gate dielectric layer 104b includes a U shape since the preferred embodiment adopts high-k last approach. More important, the barrier layer 164 (including the first protecting layer 164a and the second protecting layer 164b), which is formed by transferring an upper portion of the n-typed work function layer 162, provides superior prevention for Al diffusion and thus no more top barrier layer is required in the preferred embodiment. Accordingly, the following formed gap-filling metal layer 168 is to fill the gate trenches 150/152 with wider opening and thus gap-filling result is improved.

Figure 9:
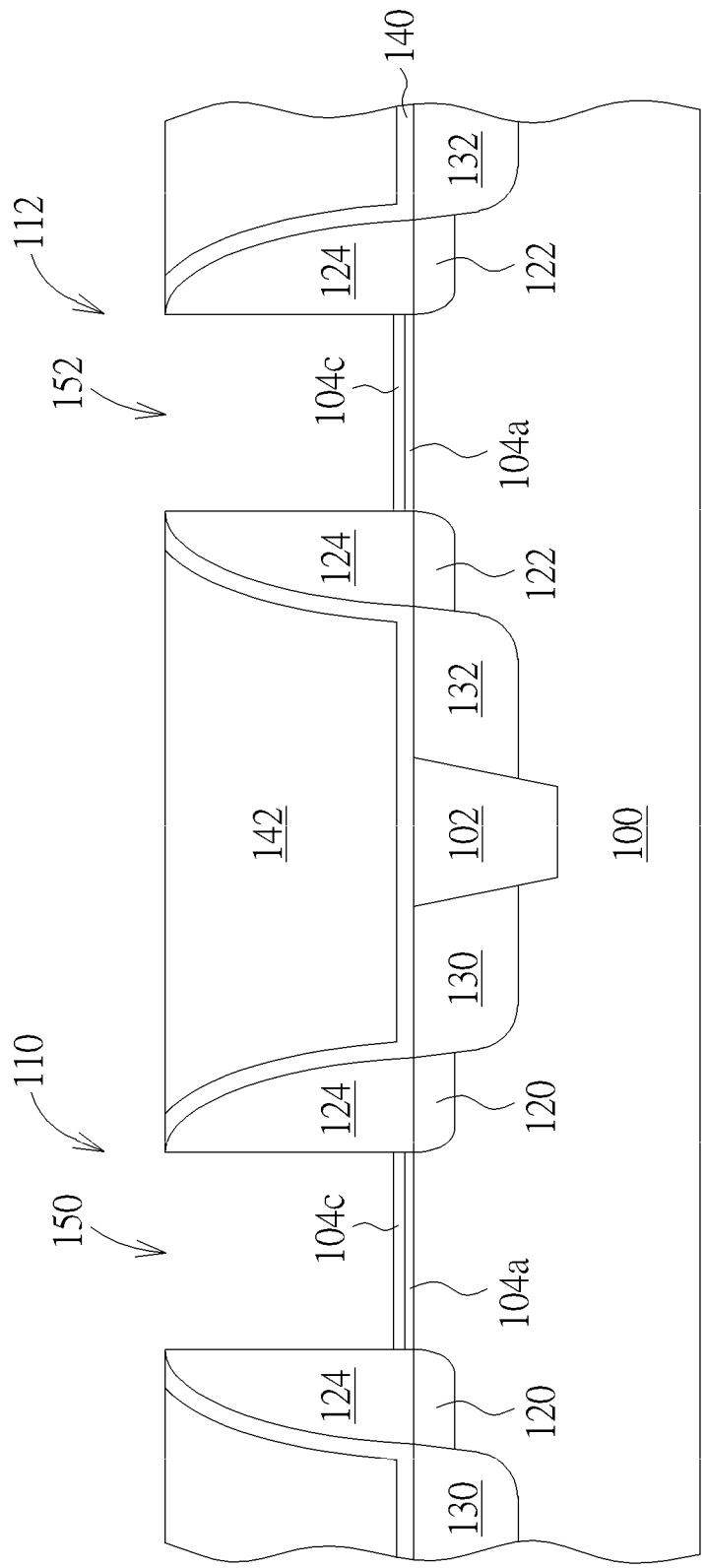
Figure 10:
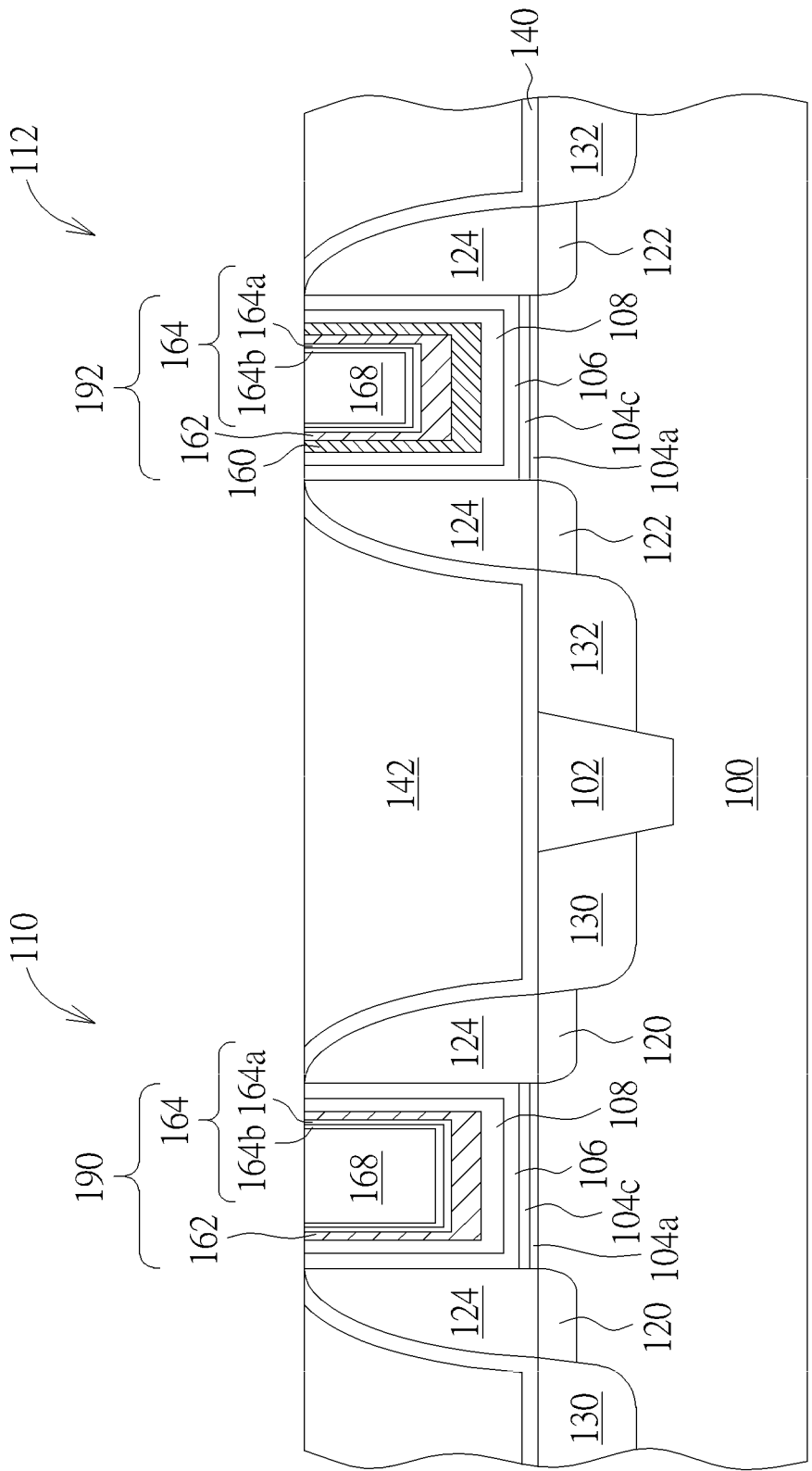

Please refer to FIGS. 9-10, which are drawings illustrating a method for manufacturing a semiconductor device having metal gate provided by a second preferred embodiment of the present invention. The method for manufacturing a semiconductor device having metal gate provided by the second preferred embodiment includes steps almost the same as mentioned in the first preferred embodiment, therefore those identical steps are omitted in the interest of brevity, and elements the same in both of the first and second preferred embodiments are designated by the same numerals. The difference between the first and second embodiments is that the second preferred embodiment adopts the high-k first approach.

Please refer to FIG. 9. According to the method for manufacturing a semiconductor device having metal gate provided by the second preferred embodiment, a substrate 100 have a first semiconductor device 110 and a second semiconductor device 112 formed thereon is provided. As mentioned above, the first semiconductor device 110 is an n-typed semiconductor device and the second semiconductor device 112 is a p-typed semiconductor device. The first semiconductor device 110 and the second semiconductor device 112 respectively include an interfacial layer 104a, a high-k gate dielectric layer 104c, a dummy gate (not shown) such as a polysilicon layer, and a patterned hard mask (not shown) formed on the polysilicon layer for defining the dummy gate. It is noteworthy that because the preferred embodiment is integrated with high-k first process, the high-k gate dielectric layer 104c includes a flap shape.

Please still refer to FIG. 9. For forming the metal gate, the hard mask layers and the dummy gates are removed to form a first gate trench 150 and a second gate trench 152. As shown in FIG. 9, the flat shaped high-k gate dielectric layer 104c is therefore exposed in the bottom of the gate trenches 150/152.

Please refer to FIG. 10. After forming the gate trenches 150/152, steps as mentioned above are performed. Those details are the same with the first preferred embodiment and thus omitted for simplicity. Consequently, a first metal gate 190 and a second metal gate 192 are obtained as shown in FIG. 10.

According to the method for manufacturing the semiconductor device having metal gate provided by the second preferred embodiment, the high-k gate dielectric layer 104c includes a flat shape since the preferred embodiment adopts high-k first approach. More important, the barrier layer 164 (including the first protecting layer 164a and the second protecting layer 164b), which is formed by transferring an upper portion of the n-typed work function layer 162, provides superior prevention for Al diffusion and thus no more top barrier layer is required in the preferred embodiment. Accordingly, the following formed gap-filling metal layer 168 is to fill the gate trenches 150/152 with wider opening and thus gap-filling result is improved.

Additionally, in another preferred embodiment of the present invention, the method for manufacturing the semiconductor device provided by the invention can be integrated with gate first approach. According to the preferred embodiment, a high-k gate dielectric layer is formed on the substrate, an n-typed work function metal layer is formed on the high-k gate dielectric layer, an nitridation process is performed to the n-typed work function metal layer to form a first protecting layer and an oxidation process is performed to the first protecting layer to form a second protecting layer. The nitridation process and the oxidation process include the same parameters as mentioned above and thus those details are omitted for simplicity. Next, gate patterning process is performed and followed by steps for forming LDDs, spacers, and source/drain, and any other required elements. Since those steps for forming the elements are well known to those skilled in the art, the details are omitted for simplicity.

Briefly speaking, according to the method for manufacturing the semiconductor device having metal gate provided by the present invention, the barrier layer is formed by sequentially performing the nitridation process and the oxidation process to the n-typed work function metal layer and thus transferring the upper portion of the n-typed work function metal layer. Therefore, no additional protecting/barrier layer is deposited on the n-typed work function metal layer in the gate trench. In other words, less layers are deposited in the gate trench and thus gap filling result of the ensuing layers formed in the gate trench is improved. Additionally, the method for manufacturing a semiconductor device having metal gate provided by the present invention can be integrated into high-k first approach and high-k last approach, even the gate-first approach, and thus provides superior manufacturability.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method for manufacturing a semiconductor device having metal gate, comprising:
providing a substrate having at least a first semiconductor device formed thereon, and the first semiconductor device comprising a first gate trench formed therein;
sequentially forming a bottom barrier layer, an etch stop layer, and a p-typed work function metal layer on the substrate;
forming an n-typed work function metal layer in the first gate trench after forming the p-typed work function metal layer;
performing a nitridation process to form a first protecting layer on the n-typed work function metal layer;
performing an oxidation process to the first protecting layer to form a second protecting layer on the n-typed work function metal layer after the nitridation; and
forming a gap-filling metal layer to fill up the first gate trench.

2. The method for manufacturing a semiconductor device having metal gate according to claim 1, further comprising forming a high-k gate dielectric layer in the first gate trench before forming the n-type work function metal layer.

3. The method for manufacturing a semiconductor device having metal gate according to claim 1, further comprising a high-k gate dielectric layer, and the high-k gate dielectric layer is exposed in the first gate trench.

4. The method for manufacturing a semiconductor device having metal gate according to claim 1, wherein the nitridation process comprises $N_2$ or $NH_3$.

5. The method for manufacturing a semiconductor device having metal gate according to claim 1, wherein the oxidation process comprises $N_2O$ or $O_2$.

6. The method for manufacturing a semiconductor device having metal gate according to claim 1, further comprising a second semiconductor device formed on the substrate, and the second semiconductor device comprises a second gate trench formed therein.

7. The method for manufacturing a semiconductor device having metal gate according to claim 1, further comprising removing the p-typed work function metal layer from the first gate trench before forming the n-typed work function metal layer.

8. A semiconductor device having metal gate comprising:
a substrate;
a high-k gate dielectric layer formed on the substrate;
an n-typed work function metal layer formed on the high-k gate dielectric layer;
a first protecting layer formed on the n-typed work function metal layer, the first protecting layer comprising a nitrified material of the n-typed work function metal layer;
a second protecting layer formed on the first protecting layer, the second protecting layer comprising an oxidized material of the first protecting layer, wherein the second protecting layer is a TiAlNO layer; and
a gap-filling metal layer directly formed on the second protecting layer.

9. The semiconductor device having metal gate according to claim 8, wherein the high-k gate dielectric layer comprises a flat shape or a U shape.

10. The semiconductor device having metal gate according to claim 8, wherein the n-typed work function metal layer comprises TiAl layer.

11. The semiconductor device having metal gate according to claim 10, wherein the first protecting layer is a TiAlN layer.

12. The semiconductor device having metal gate according to claim 8, wherein an overall thickness of the first protecting layer and the second protecting layer is smaller than a half of a thickness of the n-typed work function metal layer.

13. The semiconductor device having metal gate according to claim 8, further comprising at least a bottom barrier layer and an etch stop layer formed between the high-k gate dielectric layer and the n-typed work function metal layer.

* * * * *